United States Patent
Koizumi et al.

(10) Patent No.: US 10,883,858 B2
(45) Date of Patent: Jan. 5, 2021

(54) VEHICLE HUMAN DETECTION DEVICE

(71) Applicant: AISIN SEIKI KABUSHIKI KAISHA, Kariya (JP)

(72) Inventors: Takaaki Koizumi, Kariya (JP); Takehiro Tabata, Kariya (JP)

(73) Assignee: AISIN SEIKI KABUSHIKI KAISHA, Kariya (JP)

( * ) Notice: Subject to any disclaimer, the term of this patent is extended or adjusted under 35 U.S.C. 154(b) by 96 days.

(21) Appl. No.: 16/401,329

(22) Filed: May 2, 2019

(65) Prior Publication Data

US 2019/0353504 A1 Nov. 21, 2019

(30) Foreign Application Priority Data

May 16, 2018 (JP) ................................. 2018-094668

(51) Int. Cl.
*G01D 5/24* (2006.01)
*E05B 81/76* (2014.01)
*B60R 16/03* (2006.01)

(52) U.S. Cl.
CPC ............ *G01D 5/2405* (2013.01); *B60R 16/03* (2013.01); *E05B 81/77* (2013.01)

(58) Field of Classification Search
CPC ....... G01D 5/2405; E05B 81/77; E05B 81/78; B60R 16/03; H03K 17/962; H03K 2217/960765

USPC ....... 324/663, 519, 548, 658, 661, 662, 669, 324/671, 684, 686, 76.79, 76.81, 123 R, 324/123 C
See application file for complete search history.

(56) References Cited

U.S. PATENT DOCUMENTS

| | | | |
|---|---|---|---|
| 2007/0096905 A1 | 5/2007 | Ieda et al. | |
| 2012/0133159 A1 | 5/2012 | Tateishi et al. | |
| 2018/0037137 A1* | 2/2018 | Goedert | G01R 27/26 |
| 2018/0306603 A1* | 10/2018 | Ballam | G01R 27/2605 |
| 2020/0141989 A1* | 5/2020 | Hargreaves | H03M 3/41 |

FOREIGN PATENT DOCUMENTS

| | | |
|---|---|---|
| JP | 2005-134178 | 5/2005 |
| JP | 2012-112201 | 6/2012 |

* cited by examiner

*Primary Examiner* — Giovanni Astacio-Oquendo
(74) *Attorney, Agent, or Firm* — Oblon, McClelland, Maier & Neustadt, L.L.P.

(57) ABSTRACT

A vehicle human detection device includes: a conductive detection electrode provided in a sheet shape to cover a surface of a housing; an insulation layer stacked to cover the detection electrode; a capacitive coupling prevention electrode stacked on an area of the insulation layer that covers a non-detection area of the detection electrode other than a preset detection area; and a detection control unit configured to apply an AC voltage to the detection electrode and detect that a human touches the detection area based on a change in a capacitance of the detection electrode.

13 Claims, 2 Drawing Sheets

VEHICLE HUMAN DETECTION DEVICE

CROSS REFERENCE TO RELATED APPLICATIONS

This application is based on and claims priority under 35 U.S.C. § 119 to Japanese Patent Application 2018-094668, filed on May 16, 2018, the entire contents of which are incorporated herein by reference.

TECHNICAL FIELD

This disclosure relates to a vehicle human detection device that detects touch by a human.

BACKGROUND DISCUSSION

In the related art, a capacitance sensor has been used as a sensor that detects touch by a human. Techniques regarding such a capacitance sensor are disclosed, for example, in JP 2012-112201A (Reference 1) and JP 2005-134178A (Reference 2).

A door handle device is described in Reference 1. The door handle device is configured such that a conductive member is disposed on the design surface of a door handle and is capacitively coupled to a detection electrode incorporated in the door handle.

A vehicle human-body detection device is described in Reference 2. In the vehicle human-body detection device, a sensor electrode is provided in a door handle disposed on the exterior of a vehicle door and the approach of a human body is determined based on a change in the capacitance of the sensor electrode.

In the techniques described in References 1 and 2, the detection electrode (in a case of Reference 1) or the sensor electrode (in a case of Reference 2) is incorporated in the door handle. Therefore, the size of the detection area of a sensor is limited to the size of the door handle. In addition, for example, when the door handle is not provided, it is impossible to dispose a sensor because the detection electrode or the sensor electrode may not be incorporated. As such, the techniques described in References 1 and 2 have a limitation on the arrangement of a capacitance sensor, and there is room for improvement.

Thus, a need exists for a vehicle human detection device which is not susceptible to the drawback mentioned above.

SUMMARY

A feature of a vehicle human detection device according to an aspect of the present disclosure resides in that the vehicle human detection device includes a conductive detection electrode provided in a sheet shape to cover a surface of a housing, an insulation layer stacked to cover the detection electrode, a capacitive coupling prevention electrode stacked on an area of the insulation layer that covers a non-detection area of the detection electrode other than a preset detection area, and a detection control unit configured to apply an alternating-current (AC) voltage to the detection electrode and detect that a human touches the detection area based on a change in a capacitance of the detection electrode.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

A vehicle human detection device disclosed here is configured with a high degree of freedom in arrangement. Hereinafter, a vehicle human detection device 1 of the present embodiment will be described. In the present embodiment, a case where the vehicle human detection device 1 is used to detect that a human touches a door of a vehicle will be described by way of example.

Figure 1:
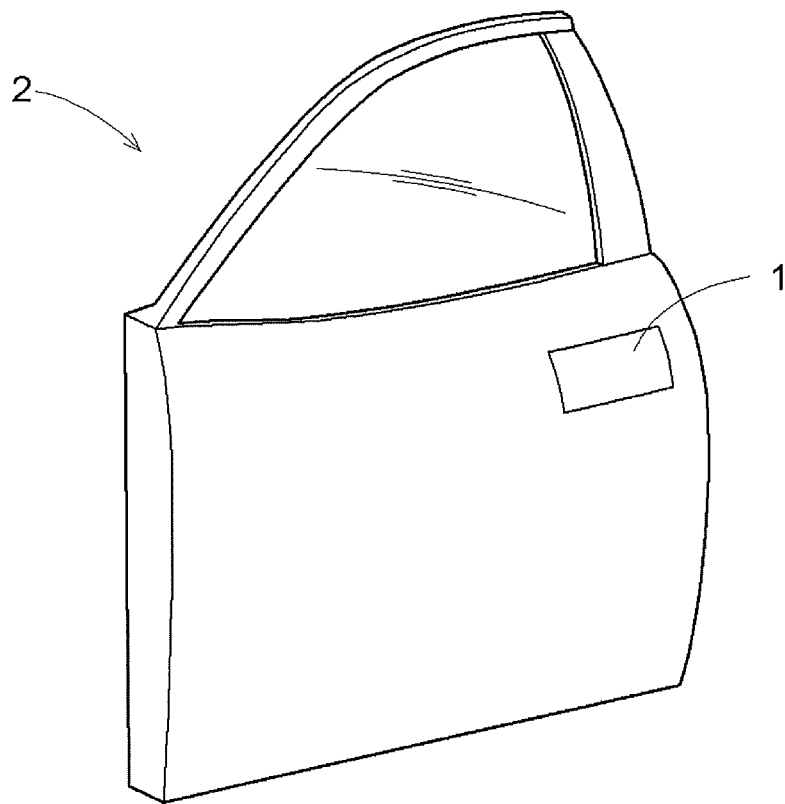
FIG. 1 is a view illustrating an arrangement example of a vehicle human detection device.

FIG. 1 illustrates an enlarged view of a door 2 of a vehicle. In the present embodiment, as illustrated in FIG. 1, the vehicle human detection device 1 is provided on the door 2. For example, instead of a door handle, the vehicle human detection device may be provided on a portion where the door handle was provided.

Figure 2:
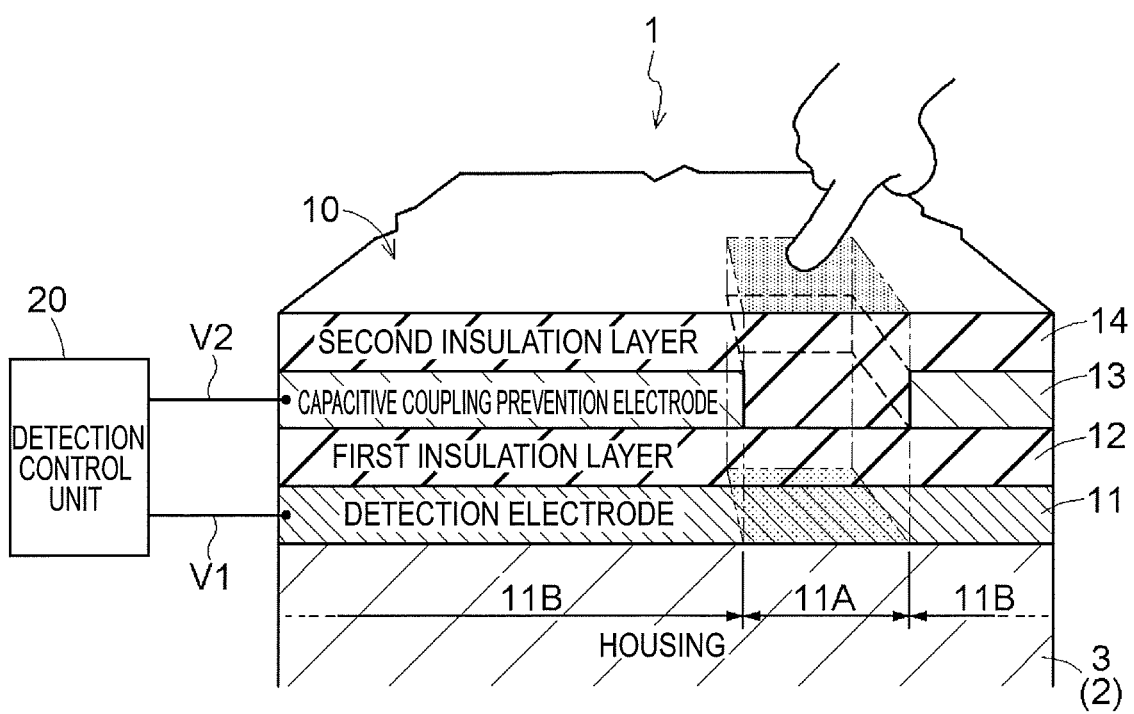
FIG. 2 is a view schematically illustrating a configuration of the vehicle human detection device.

FIG. 2 schematically illustrates a configuration of the vehicle human detection device 1. The vehicle human detection device 1 includes a sensor unit 10 corresponding to an electrode that detects touch by a human and a detection control unit 20 that controls the sensor unit 10 and determines whether or not the human touches based on an output of the sensor unit 10. The sensor unit 10 of the present embodiment includes a detection electrode 11, a first insulation layer (an example of an "insulation layer") 12, a capacitive coupling prevention electrode 13, and a second insulation layer 14.

The detection electrode 11 is provided in a sheet shape so as to cover the surface of a housing 3. Here, the vehicle human detection device 1 detects touch by the human based on a change in the capacitance of the detection electrode 11. Therefore, in order to improve the detection sensitivity of the vehicle human detection device 1, the detection electrode 11 may be insulated from other conductive members. Thus, the surface of the housing 3 on which the detection electrode 11 is provided may be a nonconductive member. In a case where the door 2 is formed of a sheet metal, the area of the door 2 that forms the sensor unit 10 may be covered with a nonconductive member. The detection electrode 11 may be provided in a sheet shape by coating a conductive member so as to cover the surface of the nonconductive member on the housing 3.

The first insulation layer 12 is stacked so as to cover the detection electrode 11. The first insulation layer 12 is provided in a sheet shape so as to cover the entire surface of the detection electrode 11. Thus, the detection electrode 11 may be sandwiched between the nonconductive member formed on the surface of the housing 3 described above and the first insulation layer 12, whereby the detection electrode 11 may be insulated.

Here, the detection electrode 11 is provided in a sheet shape so as to cover the surface of the housing 3 as described above, and a detection area 11A is preset as an area that detects touch by the human in the detection electrode 11. A non-detection area 11B corresponds to an area other than the detection area 11A set in the detection electrode 11. The capacitive coupling prevention electrode 13 is stacked on the area of the first insulation layer 12 that covers the non-detection area 11B. Thus, as illustrated in FIG. 2, the capacitive coupling prevention electrode 13 is not formed on the detection area 11A. The capacitive coupling prevention electrode 13 is formed only on the non-detection area 11B. Although details will be described later, an AC voltage is applied to the capacitive coupling prevention electrode 13 so that the capacitive coupling prevention electrode functions to eliminate capacitive coupling between the detection electrode 11 and another region.

The second insulation layer 14 is stacked so as to cover the capacitive coupling prevention electrode 13 and the first insulation layer 12 exposed on the detection area 11A. The sensor unit 10 is configured as described above such that the entire thickness thereof approximately ranges from several tens μm to several hundreds μm.

Figure 3:
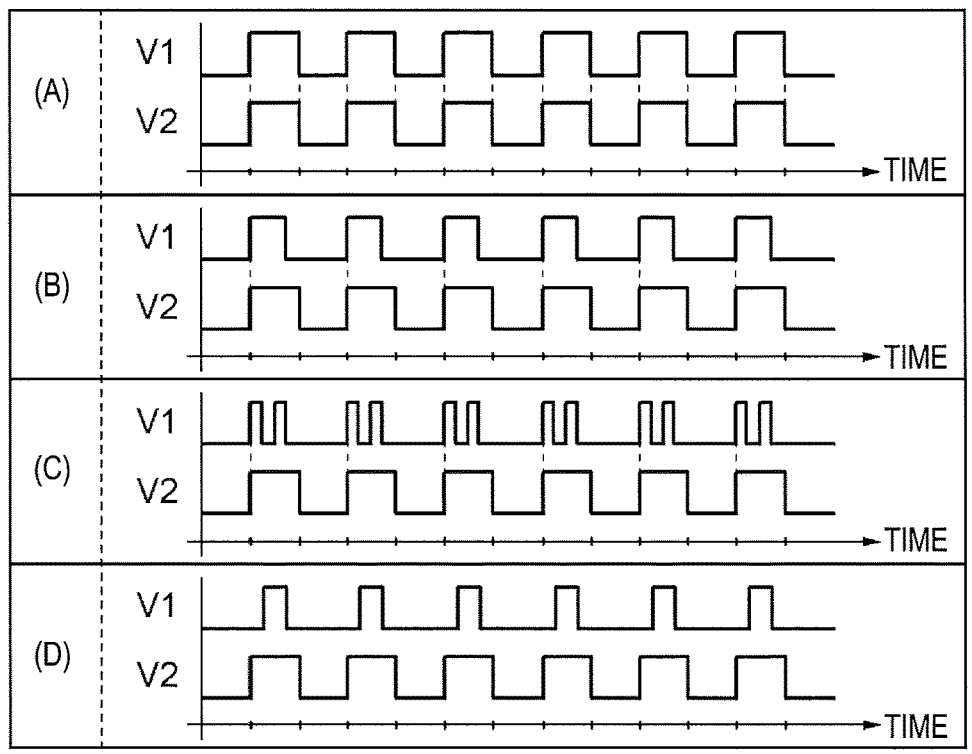
FIG. 3 is a view illustrating applied AC voltages.

The detection control unit 20 applies an AC voltage V1 to the detection electrode 11. In addition, in the present embodiment, the detection control unit 20 also applies an AC voltage V2 to the capacitive coupling prevention electrode 13. FIG. 3 illustrates four examples (A) to (D) as an example of the AC voltage V1 and the AC voltage V2.

For example, as illustrated in (A) of FIG. 3, the AC voltage V1 and the AC voltage V2 having the same voltage value and the same phase may be used. The AC voltage V1 and the AC voltage V2 may be synchronized with each other. In addition, as illustrated in (B) of FIG. 3, the AC voltage V1 and the AC voltage V2 may be configured so as to differ from each other in the time during which current is supplied in one cycle (hereinafter referred to as "current supply period") (in an example of FIG. 3, the current supply period of V1<the current supply period of V2). In addition, as illustrated in (C) of FIG. 3, the supply of current in one cycle of one of the AC voltage V1 and the AC voltage V2 (in the example of FIG. 3, the AC voltage V1) may be performed so as to be composed of a plurality of pulses. Moreover, the AC voltage V1 and the AC voltage V2 may be shifted from each other in the timing of starting the supply of current and in the timing of ending the supply of current in one cycle.

Returning to FIG. 2, the detection control unit 20 detects that the human touches the detection area 11A based on a change in the capacitance of the detection electrode 11. That is, when the human touches the second insulation layer 14 above the detection area 11A in the sensor unit 10, the capacitance of the detection electrode 11 changes compared to that in a state where no touch by the human is made. The detection control unit 20 detects that the human touches based on such a change in capacitance. Note that, the principle of detection based on such a change in capacitance is well-known, and thus, a description thereof is omitted.

The vehicle human detection device 1 configured as described above may be used, for example, as a switch that performs the locking and unlocking of a lock of the door 2. In addition, the vehicle human detection device 1 may be used as a switch that performs the latching and unlatching of a latch of the door 2, thereby being used in the door 2 provided with no door knob.

Other Embodiments

Figure 4:
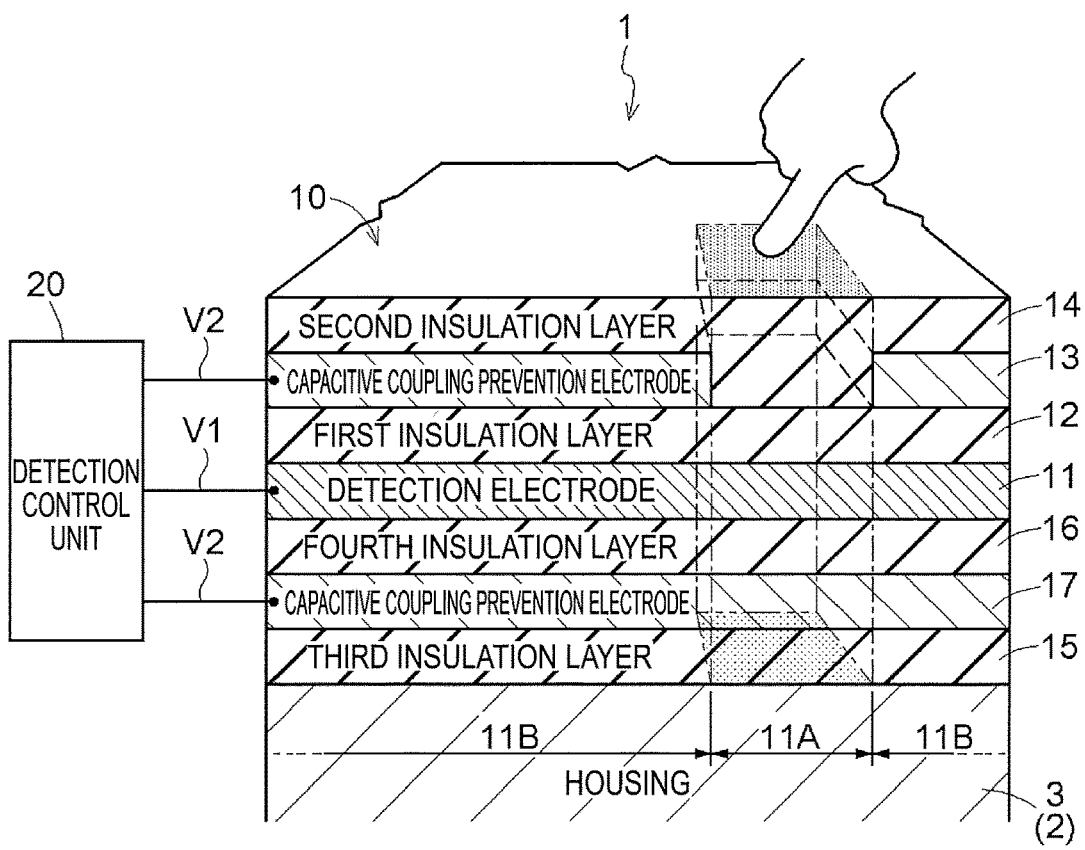
FIG. 4 is a view schematically illustrating a configuration of a vehicle human detection device according to another embodiment.

The above embodiment has described that, even when the door 2 is formed of a sheet metal, the area of the door 2 that forms the sensor unit 10 may be covered with a nonconductive member. For example, when the housing 3 is a conductive member, as illustrated in FIG. 4, a capacitive coupling prevention electrode 17 sandwiched between a pair of insulation layers (referred to as "third insulation layer 15" and "fourth insulation layer 16") may also be provided between the detection electrode 11 and the housing 3. In addition, the AC voltage V2 may be applied to the capacitive coupling prevention electrode 17 in the same manner as the capacitive coupling prevention electrode 13. Therefore, it is possible to prevent the housing 3 from affecting the capacitance.

The above embodiment been described that the AC voltage V1 is applied to the detection electrode 11. The application of the AC voltage V1 may be performed by wire or may be performed wirelessly. In a case of being performed wirelessly, the detection electrode 11 may be configured such that the AC voltage V1 is applied thereto via a drive electrode for a capacitively coupled detection electrode. In addition, the capacitive coupling prevention electrode 13 may also be configured such that the AC voltage V2 is applied thereto via a capacitively coupled electrode, and the capacitive coupling prevention electrode 17 may also be configured such that the AC voltage V2 is applied thereto via a capacitively coupled electrode.

The above embodiment has described that the detection electrode 11 is formed by coating a conductive member, but the detection electrode may be formed using a thin plate of conductive material (e.g., a metal such as copper), printing of a conductive member, or a metal thin film treatment, for example, or may be formed using a combination thereof. Of course, the capacitive coupling prevention electrode 13 and the capacitive coupling prevention electrode 17 may also be configured similarly.

In addition, the first insulation layer 12 to the fourth insulation layer 16 may be formed using a paint, a tape, a film, paper, or the like.

The above embodiment has described a case where the vehicle human detection device 1 is formed on the sheet metal of the door 2 by way of example, but the vehicle human detection device may be formed on, for example, a resin or glass of the door 2. In addition, the vehicle human detection device 1 may be used in any other than the door 2.

This disclosure may be used for a vehicle human detection device that detects touch by the human.

A feature of a vehicle human detection device according to an aspect of the present disclosure resides in that the vehicle human detection device includes a conductive detection electrode provided in a sheet shape to cover a surface of a housing, an insulation layer stacked to cover the detection electrode, a capacitive coupling prevention electrode stacked on an area of the insulation layer that covers a non-detection area of the detection electrode other than a preset detection area, and a detection control unit configured to apply an alternating-current (AC) voltage to the detection electrode and detect that a human touches the detection area based on a change in a capacitance of the detection electrode.

With such a configuration, since the detection area and the non-detection area may be freely set in the detection electrode, it is possible to achieve high convenience and a high degree of freedom in arrangement. In addition, with this configuration, it is not necessary to increase the resolution of the device because the load capacity of the detection electrode is not increased. In addition, it is possible to form a plurality of detection areas in one detection electrode as needed. In addition, since a housing that accommodates the vehicle human detection device therein is not required, it is possible to simplify the structure of the device. Thus, it is possible to realize the vehicle human detection device at low cost. In addition, with this configuration, it is possible to dispose the vehicle human detection device in the immediate vicinity of a conductive member, and no other structure is required. In addition, it is possible to form the detection area and the non-detection area along a design. Thus, there is no damage to the design of the housing provided with the vehicle human detection device. In addition, with this configuration, since the load capacity of the detection electrode is small, it is not necessary to reduce a detection threshold. Thus, it is possible to increase resistance to external noise (e.g., EMI).

It is preferable that the vehicle human detection device further includes a capacitive coupling prevention electrode that is sandwiched between a pair of insulation layers and provided between the detection electrode and the housing.

With such a configuration, even when the housing is formed of a conductive member, it is possible to reduce capacitive coupling between the detection electrode and the housing.

It is preferable that the AC voltage is applied to the detection electrode via a drive electrode for a capacitively coupled detection electrode.

With such a configuration, wiring between the detection electrode and the detection control unit is not necessary. Thus, it is possible to increase a degree of freedom in arrangement.

It is preferable that the AC voltage is applied to the capacitive coupling prevention electrode.

With such a configuration, it is possible to reduce capacitive coupling between the detection electrode and another region (e.g., a ground potential region).

It is preferable that the AC voltage applied to the detection electrode and the AC voltage applied to the capacitive coupling prevention electrode have the same voltage value and the same phase.

With such a configuration, it is possible to reduce capacitive coupling between the detection electrode and another region owing to a constant potential difference (direct current (DC)) with the detection electrode.

It is preferable that the vehicle human detection device is formed on a sheet metal of a door.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A vehicle human detection device comprising:
    a conductive detection electrode provided in a sheet shape to cover a surface of a housing;
    an insulation layer stacked to cover the detection electrode;
    a capacitive coupling prevention electrode stacked on an area of the insulation layer that covers a non-detection area of the detection electrode other than a preset detection area; and
    a detection control unit configured to apply an AC voltage to the detection electrode and detect that a human touches the detection area based on a change in a capacitance of the detection electrode.

2. The vehicle human detection device according to claim 1, further comprising:
    a capacitive coupling prevention electrode that is sandwiched between a pair of insulation layers and provided between the detection electrode and the housing.

3. The vehicle human detection device according to claim 1, wherein the AC voltage is applied to the detection electrode via a drive electrode for a capacitively coupled detection electrode.

4. The vehicle human detection device according to claim 2, wherein the AC voltage is applied to the detection electrode via a drive electrode for a capacitively coupled detection electrode.

5. The vehicle human detection device according to claim 1, wherein the AC voltage is applied to the capacitive coupling prevention electrode.

6. The vehicle human detection device according to claim 2, wherein the AC voltage is applied to the capacitive coupling prevention electrode.

7. The vehicle human detection device according to claim 3, wherein the AC voltage is applied to the capacitive coupling prevention electrode.

8. The vehicle human detection device according to claim 4, wherein the AC voltage is applied to the capacitive coupling prevention electrode.

9. The vehicle human detection device according to claim 5, wherein the AC voltage applied to the detection electrode and the AC voltage applied to the capacitive coupling prevention electrode have the same voltage value and the same phase.

10. The vehicle human detection device according to claim 6, wherein the AC voltage applied to the detection electrode and the AC voltage applied to the capacitive coupling prevention electrode have the same voltage value and the same phase.

11. The vehicle human detection device according to claim 7, wherein the AC voltage applied to the detection electrode and the AC voltage applied to the capacitive coupling prevention electrode have the same voltage value and the same phase.

12. The vehicle human detection device according to claim 8, wherein the AC voltage applied to the detection electrode and the AC voltage applied to the capacitive coupling prevention electrode have the same voltage value and the same phase.

13. The vehicle human detection device according to claim 1, wherein the vehicle human detection device is formed on a sheet metal of a door.

* * * * *